(12) United States Patent
Thuo et al.

(10) Patent No.: US 10,526,694 B2
(45) Date of Patent: Jan. 7, 2020

(54) METHOD OF PREPARING METAL SURFACES

(71) Applicant: Iowa State University Research Foundation, Inc., Ames, IA (US)

(72) Inventors: Martin Thuo, Ames, IA (US); Jiahao Chen, Ames, IA (US); Ian D. Tevis, Ames, IA (US)

(73) Assignee: Iowa State University Research Foundation, Inc., Ames, IA (US)

(*) Notice: Subject to any disclaimer, the term of this patent is extended or adjusted under 35 U.S.C. 154(b) by 601 days.

(21) Appl. No.: 14/999,340

(22) Filed: Apr. 26, 2016

(65) Prior Publication Data
US 2016/0333459 A1   Nov. 17, 2016

Related U.S. Application Data

(60) Provisional application No. 62/179,222, filed on Apr. 30, 2015.

(51) Int. Cl.
*C23C 14/34* (2006.01)
*C23C 14/16* (2006.01)

(52) U.S. Cl.
CPC ............ *C23C 14/165* (2013.01); *C23C 14/34* (2013.01)

(58) Field of Classification Search
CPC ... C23C 14/0005; C23C 14/025; C23C 14/14; C23C 14/16; C23C 14/34; C23C 14/165
See application file for complete search history.

(56) References Cited

U.S. PATENT DOCUMENTS

2004/0076757 A1* 4/2004 Jacobson ............... B05D 1/185
                                                427/402
2013/0034745 A1* 2/2013 Tachiki ................ B32B 15/015
                                                428/679

OTHER PUBLICATIONS

Samori et al; Template-Stripped Gold supported on Ni as a Substrate for SAMs; Langmuir, 1999, 15, pp. 2592-2594. (Year: 1999).*
E.A. Weiss et al., Si/SiO2-Templated Formation of Ultraflat Metal Surfaces on Glass, Polymer, and Solder Supports: Their Use as Substrates for Self-Assembled Monolayers, Langmuir, 23, 9686-9694, 2007.
V.J. Logeeswaran et al.,, Ultra-smooth metal surfaces generated by pressure-induced surface deformation of thin metal films, Appl. Phys. A 87, 187-192, 2007.
(Continued)

*Primary Examiner* — Elizabeth A Burkhart
(74) *Attorney, Agent, or Firm* — Schwegman Lundberg & Woessner, P.A.

(57) ABSTRACT

A method of preparing an ultra-flat metal surface involves providing a layer of a crystalline metallic material on an ultra-flat substrate surface that is relatively harder than the metallic material layer and then impinging the metallic material layer with incoming metal atoms that are deposited as an additive crystalline layer thereon, wherein at least a lattice constant of the additive crystalline layer is different enough from a lattice constant of the crystalline metallic material layer resulting in a reduction of roughness of the surface of the metallic material layer adjacent to the substrate surface. The metallic material layer having an ultra-flat surface then is separated by template stripping or other technique from the substrate surface for further use of the ultra-flat surface.

24 Claims, 9 Drawing Sheets

(56) References Cited

OTHER PUBLICATIONS

N. Vogel et al., As flat as it get: ultra-smooth surfaces from template-stripping procedures, Nanaoscale, 4, 3820-3832, 2012.

A.G. Cullis, The morphology and misfit dislocation formation characteristics of strained heteroeptitaxial layers: ex situ abd in in-situ growth studies, Scanninbg Microsc., 8, 957-967, 1994.

S.D. Ekpe et al., Energy deposition at the Substrate in a Magnetron Sputtering System, Reactive Sputter depositiion, Springer Berlin Heidelberg, 229-254, 2008.

F. Cuyrot-Lackmann, Adsoprtion of Transition Metal Atoms on a Transition Metal Substrate, J. Vac. Sci. Technol., vol. 9, 1045-1048, May-Jun. 1972.

Michael S. Miller et al., Ultrasmooth Gold Surfaces Prepared by Chemical Mechanical Polishing for Applications in Nanoscience, Langmuir, 30, 14171-14178, 2014.

Bongsu Jung et al., Large-scale ultraflat nanop patterned surfaces without template ersidues, Nanotechnology, 19, 1-4, 2008.

S. Seeger et al., Ion-energy distributions at a substrate in eractive magnetron sputtering discharges in Ar/H2S from copper, inidum, and tungsten targets, J. Appl. Phys., 105, pp. 053305-1 to 053305-8, 2009.

S. Tanuma et al., Calculations of electron inelastic mean free paths. IX. Data for 41 elemental solids over the 50 eV to 30 keV rnage, Surf. Interface Anal., 43, pp. 689-713, 2011.

Emily A. Weiss et al., Influence of Defects on the Electrical Characteristics of Mercury-Drop Junctions: Self-assembled Monnolayers of n-Alkanethiolates on Rough and Smooth Silver, J. Am. Chem. Soc., 129, pp. 4336-4349, 2007.

Lucas B. Newcomb et al., Odd-Even Effect in the Hydrophobicity of n-Alkanethiolate Self-Assembled Monolayers Depends upon the Roughness of the Substrate and the Oreinetation of the Terminal Moiety, Langmuir, 30, pp. 11985-11992, 2014.

Martin M Thuo et al., Odd-Even Effects in Charge Transport across Self-assembled Layers, J. Am. Chem. Soc., 133, pp. 2962-2975, Jul. 3, 2005.

Martin Hegner et al., Ultraflat atomically flat template-stripped Au surfaces for scanning probe microscopy, Surface Science, 291, pp. 39-46, 1993.

E. Chason et al., In Situ Measurements of Stress Relaxation During Strained Layer Heteroepitaxv, Mat. Res. Soc. Symp. Proc., vol. 583, pp. 167-175, 2000.

Bablu K. Ghosh et al., Ɨ Reduced-stress GaN epitaxial 1 layers grown on Si(111) by using a porous GaN interlayers converted from GaAs, J. of Crystal Growth, pp. 422-428, 2003.

J.F. Ziegler et al., Stopping of energetic light ions in elemental matter, J. Appl. Phys., 85, pp. 1249-1272, 1999.

J. F. Ziegler, The Stopping of Energetic Ions in Solids, Nuclear Instruments and Methods, 168, pp. 17-24, 1980.

James F. Ziegler et al., SRIM—The stopping and rnage of ions in matter (2010), Nuclear Instruments and Methods in Physics Research, B, 268, pp. 1818-1823, 2010.

A. Rahmatic, Reactive magentron sputter deposition of (Ti,Cu)N nnao-crystalline thin films: modeling of particle and energy flux toward the substrate, Physica Scripta, 86, 2012.

L. Todd banner et al., Pinhole-free large grained atomically smooth Au(111) substrates prepared by flame-annealed template stripping, Surf. Interface Anal., 41, pp. 49-55, 2009.

Michael Bosman et al., Encapsulated Annealing: Enhancing the Plasmon Quality Factor in Lithographically-Defined Nanostructures, Scientific Reports, 4:5537, pp. 1-6, Jul. 2, 2014.

Shu Fen Tan et al., Quantum Plasmon Resonances Controlled by Molecular Tunnel Junctions, Science, vol. 343, pp. 1496-1499, Jul. 6, 2005.

J. Narayan et al., Domain epitaxy: A unified paradigm for thin film growth, Journal of Physc.

B. Wu et al., Extreme ultraviolet lithography: A review, *J. of Vac Sci. Technol.*, B 25,(6), pp. 1743-1761, 2007.

Li Yuan et al., On the remarkable Role of Surface Topography of the Bottom Electrodes in Blocking Leakage Currents in Molecular Diodes, J. Am. Chem. Soc., pp. 6554-6557, 2014.

Li Yuan et al., Dependency of the Tunneling Decay Coefficient in Molecular Tunneling Junctions on the Topography of the Bottom Electrodes, Agnew. Int. ed., 53, 3377-3381, 2014.

H. Srringhaus, Reliability of Organic Field-Effect Transistors, Adv. Mater., 21, pp. 3859-38-3859-73, 2009.

Jiahao Chen et al., Limits to the Effect of Substrate Roughness or Smoothness on the Odd-Even Effect in Wetting Properties of n-Alkanethiolate Monolayers, Langmuir, 31, pp. 7047-7054, 2015.

S.J. Cho et al., "Nano-scale surface morphology optimization of the ohmic contacts and electrical properties of AlGaN/GaN high electron mobility transistors using rapid thermal annealing dielectric protection layer", Thin Solid Films, 557, 262, 2014.

A. Fontsere eet al., "Gate current analysis of AlGaN/GaN on silicon heterojunction transistors at the nanoscale", Applied Physics Letters, 101, 093505, 2012.

S. Pelloquin et al., LaAlO3/Si capacitors: Comparison of different molecular beam deposition conditions and their impact on electrical properties, J. Applied Physics, 113, 034106, 2013.

S. Conoci et a l, "Optically Transparent, Ultrathin Pt films as Versatile Metal Substrates for Molecular Optoelectronics", Adv. Funct. Mater., 16, 1425-1432, 2006.

S. Kakamura,"The Roles of Structural Imperfections in InGaN-Based Blue Light-Emitting Diodes and Laser Diodes", Science, 281, 956-961, 1998.

P. Nagpal et al.,"Ultrasmooth Patterned Metals for Plasmonics and Metamaterials", Science, 325, 594-597, 2009.

H. Saghrouni et al.,"Physical and electrical p characteristics of metal/Dy2O3/p-GaAs structure", Phys. B. (Amsterdam Neth.) 444, 58-64, 2014.

\* cited by examiner

Fig. 3A
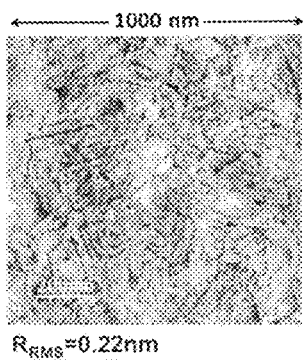
$R_{RMS}$=0.22nm
Fig. 3B
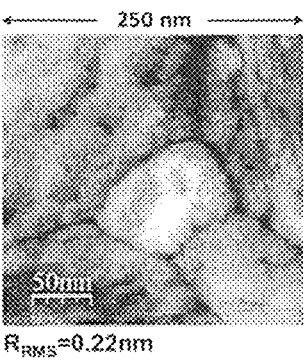
$R_{RMS}$=0.22nm
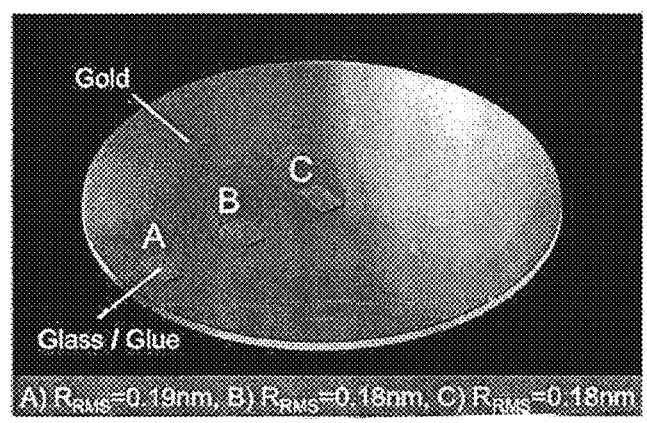
A) $R_{RMS}$=0.19nm, B) $R_{RMS}$=0.18nm, C) $R_{RMS}$=0.18nm
Fig 4

Table. 1

| Substrate/Atom | RMS (nm) | Gmax (μm2) | AGA (μm2) | Cover Percentage (%) |
|---|---|---|---|---|
| Au | 0.39±0.05 | 0.145±0.024 | 0.024±0.002 | 49±4 |
| Au/Fe | 0.24±0.01 | 0.398±0.080 | 0.043±0.003 | 68±2 |
| Au/Ti | 0.26±0.01 | 0.273±0.082 | 0.031±0.002 | 63±2 |
| Au/Cu | 0.26±0.03 | 0.298±0.085 | 0.039±0.003 | 68±1 |
| Au/Pd | 0.317±0.002 | 0.328±0.081 | 0.033±0.002 | 54±3 |
| Au/Al | 0.44±0.06 | 0.360±0.062 | 0.042±0.005 | 55±2 |

"5x5 micrometer AFM images with height range -2.0 to 2.0 nm were obtained with a size of 520x520 pixels, thus each pixel is exactly 0.0000924 square micrometers in the x-y plane. Each image was then loaded in to Fiji (Image J) and converted to an 8-bit format. From there the threshold color was reduced to 15% to eliminate the darkest regions of each images. This removes the regions where grains that fall below the average surface height by more than 0.6 nm (15% of the entire 4 nm z axis range). Then the image was converted to a binary image, which inverts the color scheme. An inversion was then performed so that the black regions represented the removed areas and the white areas were the desired grains of the surface. After that a watershed protocol was used to set the grain boundaries according to the original image. An overlay of the produced black and white image was then placed on top of the original and inspected to assure that the grains were being faithfully outlined by the Fiji protocols."

Fig. 7

| Reduction | Potential (V) |
|---|---|
| $Al^{3+} \rightarrow Al$ | -1.66 |
| $Ti^{4+} \rightarrow Ti$ | -0.88 |
| $Zn^{2+} \rightarrow Zn$ | -0.76 |
| $Fe^{3+} \rightarrow Fe$ | -0.04 |
| $Fe^{2+} \rightarrow Fe$ | -0.44 |
| $Cu^{2+} \rightarrow Cu$ | 0.34 |
| $Cu^{+} \rightarrow Cu$ | 0.52 |
| $Ag^{+} \rightarrow Ag$ | 0.80 |
| $Pd^{2+} \rightarrow Pd$ | 0.99 |
| $Au^{3+} \rightarrow Au$ | 1.50 |
| $Au^{+} \rightarrow Au$ | 1.69 |

Fig. 10

METHOD OF PREPARING METAL SURFACES

RELATED APPLICATION

This application claims benefit and priority of provisional application Ser. No. 62/179,222 filed Apr. 30, 2015, the disclosure of which is incorporated herein by reference.

FIELD OF THE INVENTION

The present invention relates to a method of preparing a thin metal film that is ultra-flat, has tunable roughness, and/or has tunable morphologies that is useful as a substrate or platform for nanoscale technologies in the form of a two-dimensional monolayer such as a self-assembled monolayer; a multilayer structure; molecules themselves; or other form.

BACKGROUND OF THE INVENTION

Substrate(s) with an ultra-flat metal surface is/are important in two-dimensional materials research and in nano-structure fabrication, such as, for example, especially in formation of self-assembled monolayers (SAM's). In these applications, the substrate surface roughness dominates the nano-structure and hence the properties of the materials deposited and/or formed on the substrate surface.

Currently available techniques to prepare flat metal surfaces include electron-beam physical vapor deposition, chemical-mechanical polishing, template-stripping, and thermal annealing. Electron-beam physical vapor deposition involves direct physical vapor deposition (PVD) of an evaporated metal where control of the evaporation rate, and hence grain growth, can be used to control the roughness of the deposited material.

Chemical-mechanical polishing involves polishing a substrate surface wherein a slurry of an etchant is used to remove surface asperities.

Template stripping embodies evaporation of a metal onto an ultra-flat template surface followed by lift-off using an attached support to free the deposited metal layer for further use.

Thermal annealing is used to induce atom mobility and hence minimize grain boundaries of deposited material and can be used together with other techniques, such as template stripping, to provide smooth flat substrate surfaces.

However, there is a need for a method for preparing an ultra-flat metal surface that is improved over existing techniques. Since surface morphology affects the performance and structure of such devices, there also is need for surfaces whose roughness can be readily tuned and their morphology (defect density, mechanical properties, grain sizes, defect types, defect sizes) are controlled.

SUMMARY OF THE INVENTION

The present invention provides a method of preparing an ultra-flat surface to this end wherein the method involves providing a layer of a crystalline (e.g. polycrystalline) metallic material on an ultra-flat substrate surface so that a surface of the layer is adjacent to the substrate surface at an interface and impinging an opposite surface of the metallic material layer by incoming metal atoms, which are deposited as an additive layer (ad-layer), having at least a reference or measured lattice constant different enough from a reference or measured lattice constant of the additive layer that an ultra-flat surface is produced on the surface of the metallic layer that is adjacent the substrate surface. The metallic material layer then is separated by template stripping or other technique from the substrate surface for use of its ultra-flat surface in two-dimensional materials research, in nanostructure fabrication, such as especially in formation of self-assembled monolayers (SAM's), and other uses.

A metallic material layer is thereby produced including the ultra-flat surface preferably with an average surface roughness less than 0.45 nm RMS, more preferably with a surface in the range of about 0.18 to about 0.3 nm RMS, and including an opposite surface having the additive layer of the metal atoms thereon, although practice of the invention pursuant to certain other embodiments thereof can produce a controlled surface roughness in the range less than 5 nm RMS, such as preferably from about 0.18 to about 3.5 nm RMS, depending upon the metallic material layer employed.

In an illustrative embodiment of the present invention, a lattice constant mismatch (%) between the metallic material and the additive layer greater than about 0.1% results in an average RMS surface roughness of less than about 0.45 nm over at least a portion of the area of the ultra-flat surface of the metallic material layer in cases where the metal being reconstructed has a high redox potential (for example gold).

For a metallic material layer comprised of a metal less noble than gold, such as for example a noble metal other than gold (e.g. Ag) or a non-noble metal (e.g. Fe), the lattice constant and also an electronic interaction factor, such as atomic binding energy represented by a reference redox potential, of the metallic material layer can be selected to be different enough from a lattice constant and electronic interaction factor of the additive layer that an ultra-flat surface is produced on the surface of the metallic layer that is adjacent to the substrate surface, wherein the surface roughness and morphology are tunable by selection of the particular additive layer relative to the metallic material layer.

In a particular illustrative embodiment of the present invention, the substrate material can comprise a substrate derived from single crystal Si wafer, cleaved mica, cleaved gypsum, single crystal, or other material. The metallic material deposited on the substrate can comprise a noble metal (e.g. at least one of Au, Ag, Pt, Pd) or a non-noble metal (e.g. at least one of Cu, Re, Ru, Ti, and V). The incoming metal atoms can comprise at least one of Fe, Pd, Cu, Ti, Zn, Re, and W, and others, that are deposited, e.g. by sputtering from a target source, to impinge on the metallic material layer. For example, such other incoming metal atoms can comprise at least one a metal, a metalloid, or an alloy that comprises at least one of Al, Ga, In, Sn, and Bi.

The above advantages of the invention will become more readily apparent from the following description taken with the following drawings.

DESCRIPTION OF THE DRAWINGS

FIGS. 3A and 3B are STM images of the stripped surface of the composite Au layer-Fe layer of FIGS. 2C, 2F, 2I, and 2L.

FIG. 4 is a schematic drawing showing little effect of spatial location on a Si wafer on surface roughness of the ultra-flat surface.

FIG. 7 shows Table 1 having supporting information used to generate the data of FIGS. 5A, 5B, 5C and 6.

FIG. 8A-8F illustrate that different metal ad-layers lead to tunable roughness of resultant Ag surface analyzed by atomic force microscopy (AFM) and crystal structure analyzed by wide angle X-ray diffraction wherein FIGS. 8A-8D are AFM images of template shipped silver surface and corresponding projection lines. FIG. 8E shows surface RMS roughness of silver surface annealed with different metal ($R_{RMS}$ from low to high). FIG. 8F shows X-ray diffraction patterns of $Ag^{TS}$ and $Ag^{M\text{-}TS}$ silver surfaces.

FIGS. 9A-9C show 3D demonstration of penetration of Fe, Zn and Al atoms into silver substrate. FIGS. 9D and 9E show simulation of ion penetration and recoil energy of ions adsorbed on silver substrate. FIG. 9F shows RMS roughness of silver surfaces with regard to the lattice mismatch of silver and ad-layer metal.

FIG. 10 contains Table I entitled Standard (reference) reduction potential of metals

DESCRIPTION OF THE INVENTION

For purposes of illustration and not limitation, the present invention will be described immediately below with respect to preparing an ultra-flat surface on a crystalline (e.g. polycrystalline) gold (Au) layer wherein the ultra-flat surface exhibits an average surface roughness approaching 0.2 nm RMS, such as an RMS preferably below 0.45 nm and preferably from 0.18 to 0.3 nm. Practice of the present invention is not limited to preparing an ultra-flat surface on a Au layer since other metallic material layers can be prepared having an ultra-flat surface. Such other metallic material layers include, but are limited to, (a) other noble metal layers (e.g. Ag layer, Pt layer, Pd layer and combinations thereof) and (b) non-noble metals such as a transition metal comprising at least one of Cu, Re, Ru, Ti, and V as well as their alloys. Example 2 describes practice of embodiments of the invention using crystalline (e.g. polycrystalline) silver (Ag) layer wherein average surface roughness values of less than 5 nm RMS, such as 0.18 to 3.5 nm RMS are tunable by selecting a particular additive (ad-layer).

Figure 1:
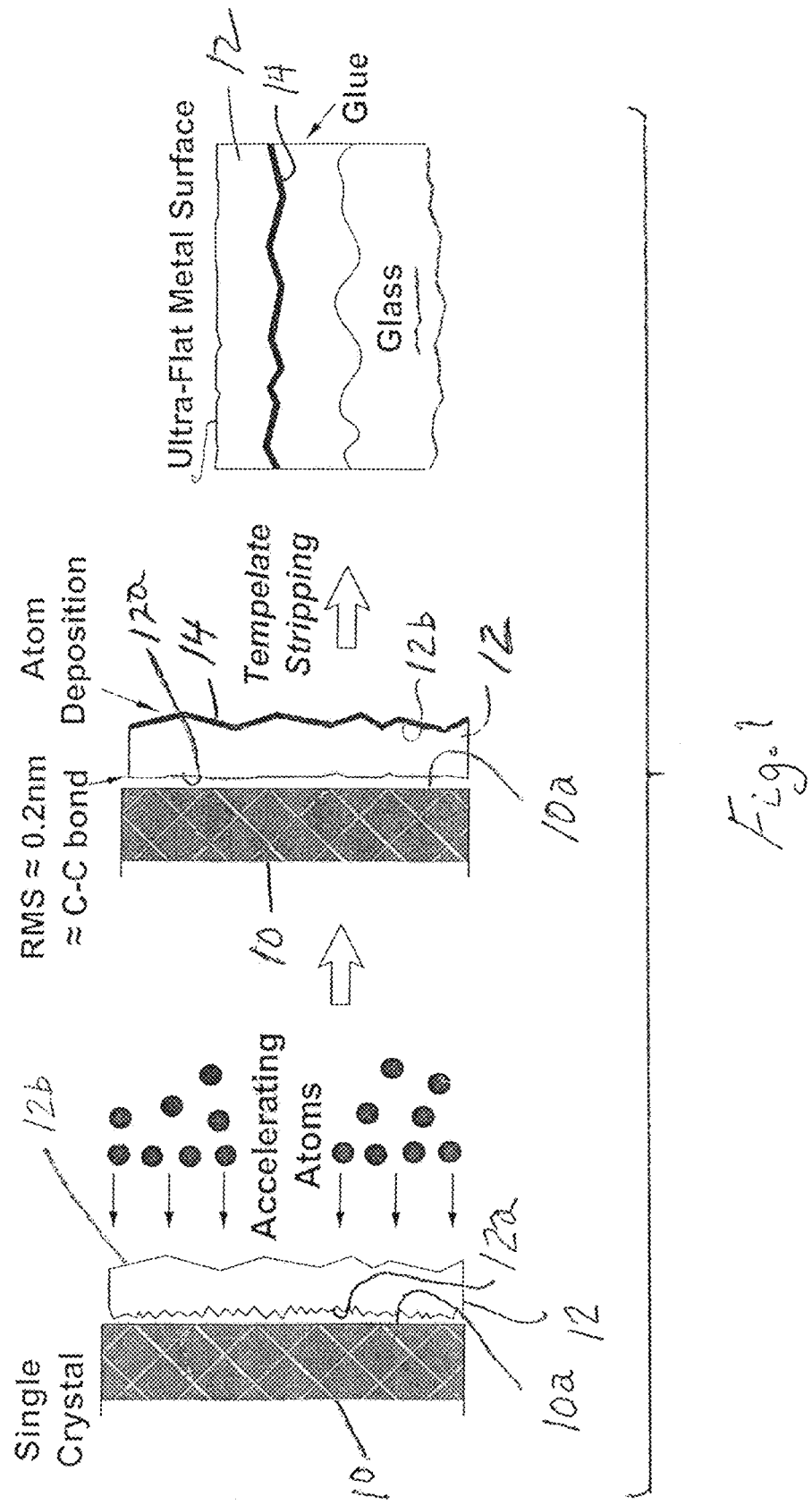
FIG. 1 is a schematic of an illustrative method embodiment of the present invention.

Pursuant to an illustrative embodiment of the present invention, a substrate 10 having a near atomically flat template surface 10a, FIG. 1, and being relatively harder than the metallic material layer to be deposited thereon is provided as a starting step. Such substrates are known and include, but are not limited to, a single crystal Si wafer, cleaved mica, cleaved gypsum or other substrate material. The substrate template surface preferably will be as close to atomically flat (e.g. RMS average surface roughness of about 0.2 nm where RMS is root mean squared) as possible so as to function as a template for the Au layer (or other metallic material layer) to be deposited thereon. A single crystal Si wafer, which can have a native oxide thereon, is a preferred substrate to facilitate ready and reliable stripping of the subsequently formed ultra-flat surface therefrom.

Referring to again FIG. 1, in practice of an illustrative embodiment of the present invention, the polycrystalline Au layer 12 (or other metallic material layer) is deposited on the ultra-flat, relatively hard substrate 10 having the template surface 10a so that an inner interfacial surface 12a of the Au layer 12 is adjacent to and forms an interface with the substrate surface 10a and an exposed outer surface 12b faces in the opposite direction.

The Au layer 12 solidified and crystallizes on the substrate surface 10a to lattice structural units and includes a particular grain size and polycrystalline or other structure depending upon the deposition parameters. Deposition conditions that produce a larger grain size of the polycrystalline Au layer are beneficial.

The polycrystalline Au layer 12 can be deposited on the substrate 10 by electron-beam (EBeam) physical vapor deposition or any other known PVD, CVD, electroplating, or other deposition technique to a thickness typically from about 100 nm to about 600 nm or more depending on the intended use. For example, the substrate 10 can be positioned in an EB-PVD chamber where an electron beam scans and heats a surface of a solid Au target source to evaporate Au atoms, which are deposited on the substrate surface 10a located above the target source so that the Au layer is formed having interfacial surface 12a at the interface with the substrate surface 10a.

Again referring to FIG. 1, the outer surface 12b of the Au layer 12 (or other metallic material layer) is impinged or bombarded by incoming metal atoms, which are deposited as an additive layer 14 (ad-layer) on the outer surface of the crystalline Au layer 12. The additive layer 14 solidifies on the Au layer 12. The additive layer may crystallize to its native lattice structural unit (e.g. crystal structure=body centered cubic when Fe atoms are deposited or face centered cubic when Al atoms are deposited and crystallized on the Au layer) or to a metastable or other crystal structural unit, and may possibly alloy with the Au layer. At least the lattice constant of the metallic atoms of the additive layer (e.g. Fe atoms) is selected to be different enough from the lattice constant of the Au (or other metallic material) of layer 12 (or other metallic material layer) such that the impingement/additive layer achieve a reduction in the sizes of asperities on inner surface 12a of the crystalline Au layer 12. Although not wishing to be bound by any theory as to this effect, it appears that the impingement kinetic energy and crystallization of the additive layer 14 on the Au layer 12 induce interfacial stress at the Au surface 12a to atomically reconstruct the surface 12a possibly via solid state stress relaxation phenomena in a manner to better conform the surface 12a to the near atomically-flat substrate template surface 10a. Regardless of theory, practice of the present invention produces an ultra-flat surface 12a of the Au layer 12 exhibiting an average surface roughness approaching 0.2 nm RMS, such as typically less than 0.45 nm and more preferably in the range of about 0.18 to about 0.3 nm RMS as will become evident from the examples set forth below. Any crystalline metallic material that is ductile enough to be strained at the interface with the substrate surface thus can be used in practice of the invention.

The lattice constant of the metallic material layer (e.g. Au) typically is selected from a reference lattice constant value taken from the Periodic Table of the Elements, although the lattice constant of the metallic material layer can be a measured lattice constant value taken from the actual metallic material layer. The same is true with respect to the lattice constant value selected for the bombarding metallic atoms that form the ad-layer. That is, the lattice constant of the ad-layer (e.g. Al layer) typically is selected from a reference lattice constant value taken from the Periodic Table of the Elements, although the lattice constant of the ad-layer can be a measured lattice constant value taken from the actual deposited ad-layer. Selection of the lattice constant values from the Periodic Table of the Elements for the ad-layer as well as the metallic material layer preferably is employed in practice of the embodiments of the invention in order to help pre-select the appropriate bombarding metallic atoms for a particular metallic material layer of interest.

The incoming, impinging metal atoms can comprise a metal comprising at least one of Fe, Ni, V, Cr, Mn, Ta, Sc, Zr, Nb, Ru, Pd, Cu, Ti, Zn, Re, and W atoms that impinge and are deposited on the outer surface 12b of the crystalline Au layer (or other metallic material layer). The incoming, impinging atoms also can comprise a metal, a metalloid, or an alloy of at least one of Al, Ga, In, Sn, Pb, and Bi, or an alkali or alkaline earth metal or alloy that comprises Li, Ca, and Mg.

The incoming metal atoms can be provided by conventional sputtering processes from a target source so as to accelerate toward and impinge on the outer surface 12b of the crystalline Au layer. For example, the substrate 10 having the Au layer 12 thereon is placed in a conventional sputtering chamber where the metal atoms are physically ejected from a solid target metal source and accelerate toward the substrate as assisted by an electric field between the source and the substrate. The additive layer 14 is deposited on the Au layer where the additive layer 14 solidifies and may crystallize to its native lattice structural unit (crystal structure) or to a metastable or other crystal structural unit, or may possibly alloy with the metallic material. The additive layer 14 exhibits a particular grain size and structure depending upon the metal atoms deposited and deposition parameters. In lieu of sputtering processes, the invention envisions using other processes, such as any PVD, CVD, and electrochemical deposition, to generate the incoming flux of metal atoms.

Following deposition of the additive layer 14, the Au layer 12 (or other metallic material layer) then is separated from the substrate surface 10a by template stripping or other separation technique as illustrated schematically in FIG. 1. For example, a glass slide can be fastened by adhesive to the additive layer 14. Then, the crystalline Au layer 14 is separated from the substrate surface 10a by cleaving at the interface as described, for example, in Weiss et al., Langmuir, Vol. 23, No. 19, pp. 9686-9694, 2007, which is incorporated by reference herein to this end.

The following Examples are offered to illustrate practice of the invention is more detail without limiting the scope of the invention.

EXAMPLES

Example 1

This Example is offered to further illustrate certain method embodiments of the invention using a gold (Au) layer.

Single crystal Si wafers (4 inch diameter) were used as the substrates. Each Si wafer provided an ultra-flat template surface (e.g. approaching 0.1 nm RMS) on which a crystalline Au layer was first deposited to a thickness of 200 nm using a commercially available Sharon e-Beam Evaporator EE-3 (or similar) EB-PVD.

Figures 2A, 2B, 2C, 2D, 2E, 2F, 2G, 2H, 2I, 2J, 2K, 2L:
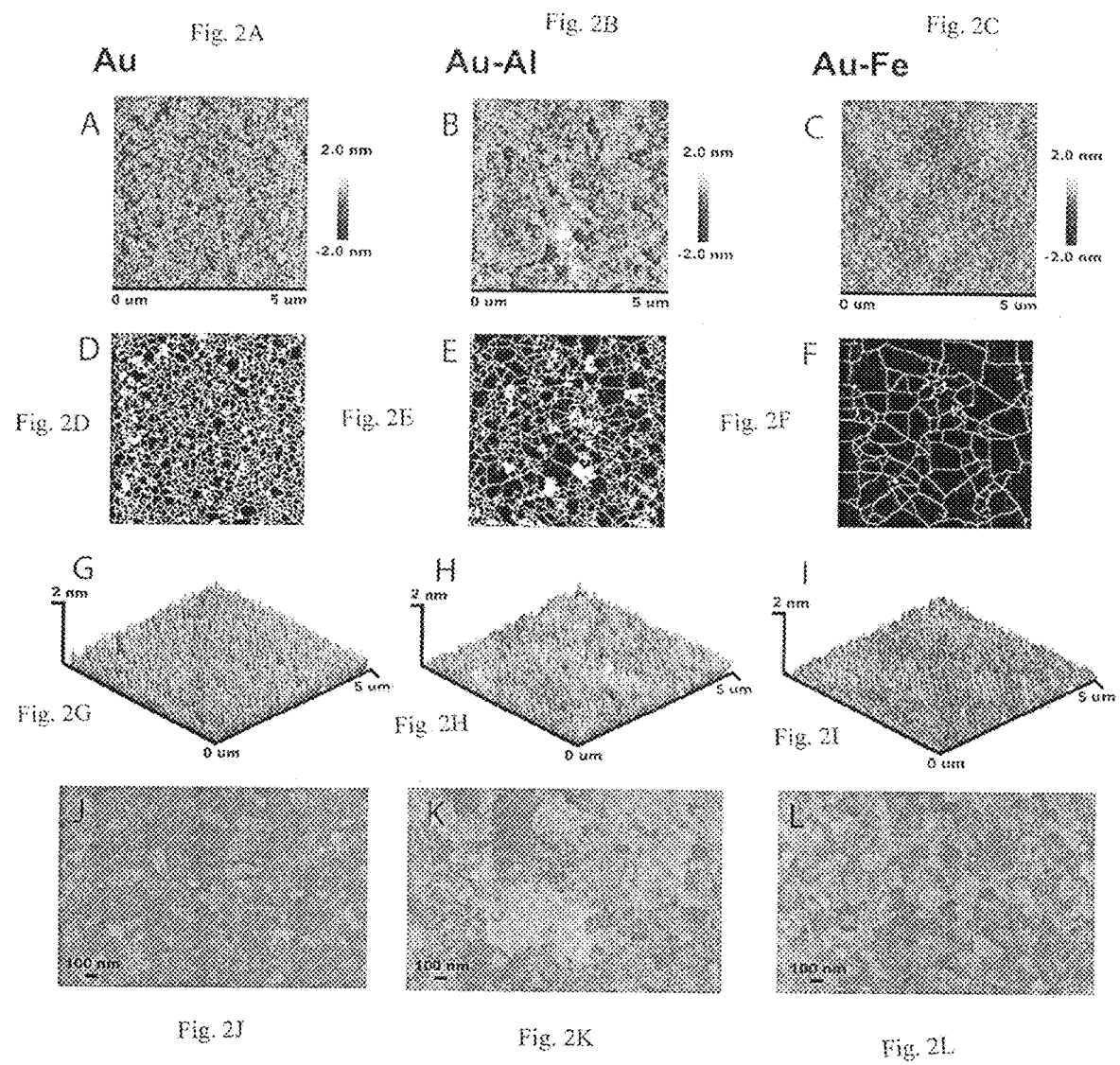
FIGS. 2A, 2D, 2G, and 2J are AFM images of the stripped surface of a Au layer deposited on and stripped from a Si wafer without being impinged by incoming metal atoms. The AFM images are taken in the contact mode.
FIGS. 2B, 2E, 2H, and 2K are AFM images of the stripped surface of a composite Au layer-Al layer after impingement by incoming Al atoms and after removal by template stripping.
FIGS. 2C, 2F, 2I, and 2L are images of the stripped surface of a composite Au layer-Fe layer after impingement by incoming Fe atoms and after removal by template stripping.

Thereafter, each Si wafer with the crystalline Au layer thereon was placed in a commercially available AJA 6 target sputter deposition system sputtering system (or similar) to impinge and deposit respective different metal atoms as a crystalline additive layer on the crystalline Au layer as described above. The experiments employed Fe, Al, Ti, Cu, and Pd metal atoms to this end to evaluate the effect of various parameters including their atomic radii, molecular weight and the lattice constants on the surface roughness of the crystalline Au layer at the interface with the Si wafer substrate. The sputtering machine was operated at $3 \times 10^{-7}$ torr pressure and appropriate settings based on Z-value of the requisite metal or as desired to give a slow deposition of not more than 30 Angstroms of deposited material per minute FIGS. 2A, 2D, 2G, and 2J are atomic force microscope (AFM) images of the stripped surface of a crystalline Au layer EB-PVD deposited on a Si wafer without being impinged by incoming metal atoms. This experiment serves a comparison example. FIGS. 2A, 2D and 2J illustrate the grain size and structure of the polycrystalline Au layer. FIG. 2G illustrates the measured surface heights across an area of the crystalline Au layer (see Table 1 of FIG. 7 for supporting information for testing)

FIGS. 2B, 2E, 2H, and 2K are AFM images of the stripped surface of the composite Au layer-Al layer after impingement by incoming Al atoms and removal by template stripping. FIGS. 2B, 2E and 2K illustrate the grain size and structure of the Au layer-Al layer. FIG. 2H illustrates the measured surface heights across an area of the composite Au layer-Al layer (see Table 1 of FIG. 7 for supporting information for testing).

FIGS. 2C, 2F, 2I, and 2L are images of the stripped surface of the composite Au layer-Fe layer after impingement by incoming Fe atoms and removal by template stripping.

FIGS. 2C, 2F and 2L illustrate the grain size and structure of the composite Au layer-Fe layer. FIG. 2I illustrates the measured surface heights across an area of the Au layer-Fe layer (see Table 1 of FIG. 7 for supporting information for testing).

FIGS. 3A and 3B are STM images of the stripped surface of the composite Au layer-Fe layer of FIGS. 2C, 2F, 2I, and 2L.

FIG. 4 is a schematic figure showing there is little effect of spatial location on a Si wafer on surface roughness of the stripped surface of the Au layer-Fe layer. It is apparent that surface roughness is substantially uniform across the covered area of the Si wafer substrate.

Figure 5A:
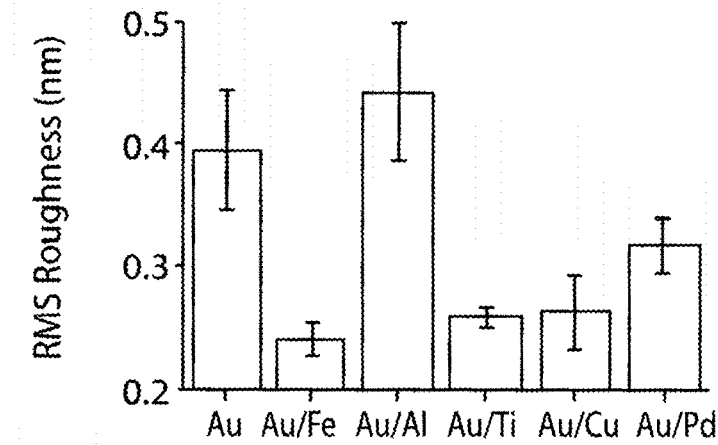
FIG. 5A is a bar graph of RMS roughness versus different combinations of the Au layer and the additive crystalline layers; i.e., Au—Fe layer, Au—Al layer, Au—Ti layer, Au—Cu layer, and Au—Pd layer.

FIG. 5A is a bar graph of RMS roughness versus combinations of the Au layer and the different additive crystalline layers; i.e., Au layer-Fe layer, Au layer-Al layer, Au layer-Ti layer, Au layer-Cu layer, and Au layer-Pd layer.

Figure 5B:
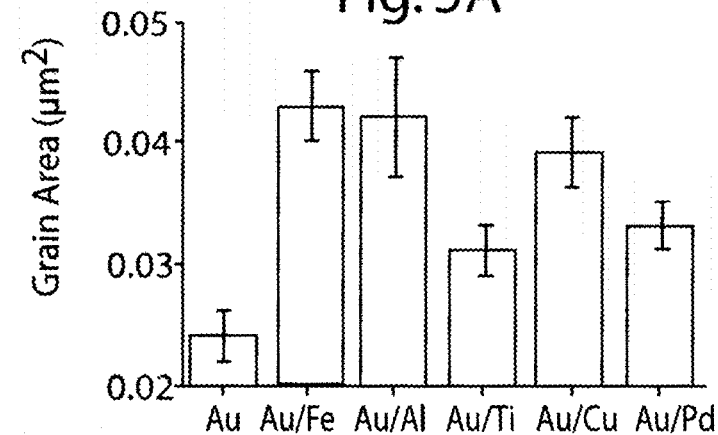
FIG. 5B is a bar graph of the average grain area (grain size) versus the different combinations of the Au layer and the additive layers.

FIG. 5B is a bar graph of grain area (grain size) versus the combinations of the Au layer and the different additive crystalline layers.

Figure 5C:
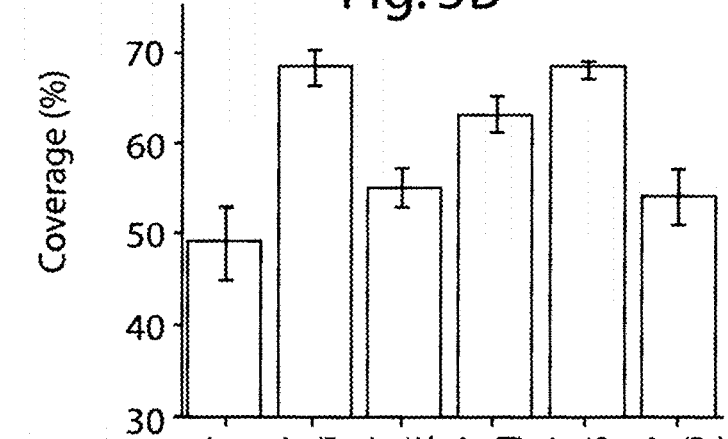
FIG. 5C is a bar graph of surface coverage (amount of Au surface available within 1 Angstrom of the midline in the AFM image).

FIG. 5C is a bar graph of wafer surface coverage versus the combinations of the Au layer and the different additive crystalline layers.

FIG. 5A demonstrates that the average surface roughness of the stripped Au surface (surface 12a of FIG. 1) is less than about 0.3 nm RMS (root mean squared) and in the range of about 0.2 nm to about 0.3 nm when the incoming atoms are sputtered Fe atoms, Ti atoms, or Cu atoms crystallized on the crystalline Au layer. Use of incoming sputtered Fe atoms produced the largest grain size and the most coverage of the Si wafer.

Figure 6:
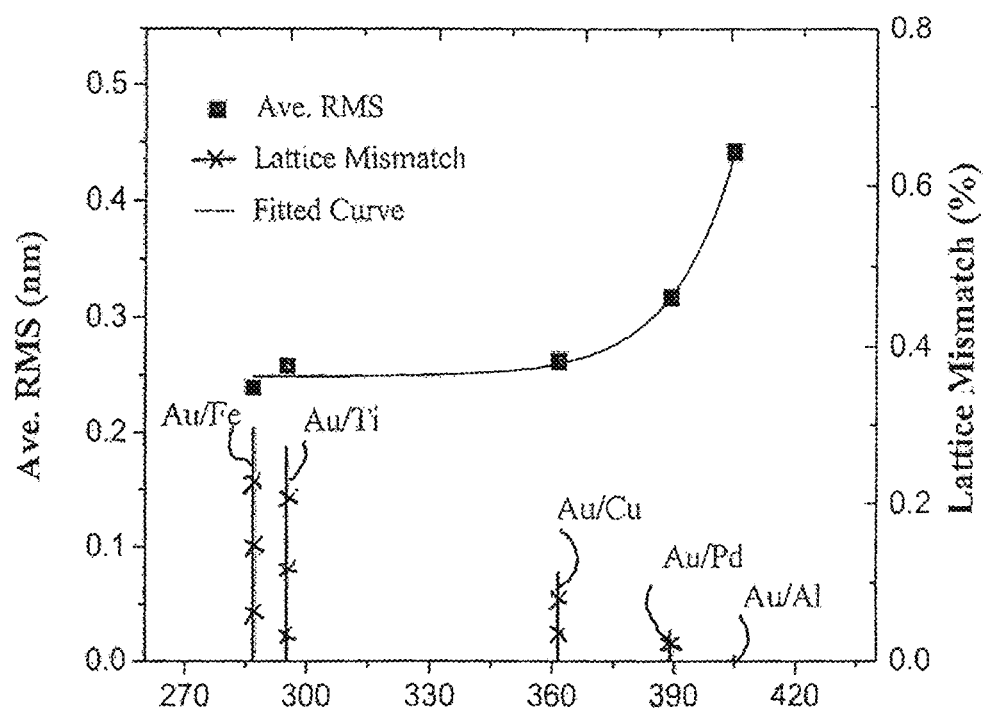
FIG. 6 is a graph of average RMS (nm) and lattice mismatch (%) versus lattice constants (in picometers) of the crystallized additive layer metal; i.e., Fe layer, Ti layer, Cu layer, Pd layer, and Al layer. The lattice mismatch % is calculated by subtracting the lattice constant of the crystalline additive layer metal from the lattice constant of the crystalline Au layer (Au lattice constant=4.080 Angstroms) and dividing the difference by the lattice constant of Au and converting this quotient to %. The respective lattice mismatches are shown as the vertical lines designated Au/Fe, Au/Ti, Au/Cu, Au/Pd, and Au/Al in FIG. 6.

FIG. 6 is a graph of average RMS (nm) and lattice mismatch (%) versus lattice constants (in micrometers) of the additive metal layer; i.e., Fe layer, Ti layer, Cu layer, Pd layer, and Al layer. The lattice mismatch % is calculated by subtracting the lattice constant of the additive crystalline metal layer from the lattice constant of the crystalline Au layer (4.080 Angstroms) and dividing the difference by the lattice constant of Au and converting this quotient to %. The lattice mismatch % is shown as the vertical lines designated Au/Fe, Au/Ti, Au/Cu, Au/Pd, and Au/Al in FIG. 6.

FIG. 6 shows a plot of the data of FIG. 7 illustrating the relationship of the lattice constant mismatch % and the average RMS of the stripped Au surface wherein higher lattice constant mismatch is shown to produce a lower average surface roughness. The atomic radii and molecular weight of the incoming metal atoms (e.g. Fe, Ti, etc.) was observed to have little effect on the average RMS achievable on the stripped Au surface. Again, FIG. 6 reveals that the presence of a lattice constant mismatch % greater than about 0.1% results in an average RMS (nm) less than about 0.3 nm RMS in the range of about 0.2 nm to about 0.3 nm over the covered portion of Si wafer.

Practice of the invention thus produced an ultra-flat surface of the crystalline Au layer with an average RMS surface roughness less than 0.45 nm, preferably between 0.18 to 0.3 nm, for use in two-dimensional materials research, in nano-structure fabrication, such as especially in formation of self-assembled monolayers (SAM's), and other uses.

Example 2

This Example is offered to further illustrate certain method embodiments of the invention using a silver (Ag) layer to produce a tunable surface roughness and morphology.

Materials: Metal films were evaporated by contract research entities (such as Substrata Thin Film Solutions Inc., 2455 Wyandotte St. W., $2^{nd}$ Floor Windsor, ON, Canada N9B 1K3) or prepared in-house using an e-beam evaporator and a sputter systems as described above. A 200 nm Ag was evaporated onto silicon wafer (Si [100]), followed by a sputtering of 10 nm metal ad-layer (Fe, Al, Pd, Cu, Zn and Ti) onto Ag film. All metal substrate were used as received.

Template-stripped surface: All Ag surfaces were obtained by template stripping the metal substrates as generally described above. A glass piece was rinsed with ethanol and dried with nitrogen gas. A droplet of estimated 8 μL optical glue (Norland Optical Adhesive 61) was applied to adhere the glass piece to the metal substrate. The glue was cured under UV exposure for 12 hrs, after which the glass piece was stripped off the silicon substrate by a razor blade.

Characterization: All $Ag^{TS}$ (template stripped Ag layer) surfaces and $Ag^{M-TS}$ (template stripped Ag layer/metal ad-layer) surfaces were characterized with AFM using tapping mode. Roughness was directly calculated from the AFM images using Gwyddion software. Wide angle X-ray diffraction was used to investigate the crystallinity of template stripped metal films at a scan rate of 1° per minute. XPS surface and depth profile analysis was performed on as-produced metal/Ag films on silicon using a Thermo Scientific K-Alpha XPS with an Al Kα X-ray source, where a 200 μm spot size was used for all analysis. A survey scan was first conducted to qualitatively identify elements on the surface of the thin films using a pass energy of 200 eV (average of 5 scans, dwell time at each step of 10 ms, energy step size of 1.0 eV). Electron flood gun was kept active to prevent charging. Quantification of the elements was performed at signature peaks of each metal, using a pass energy of 50 eV (average of 2-15 scans, dwell time at each step of 50 ms, energy step size of 0.1 eV). An argon ion beam was used to mill the surfaces for depth. Peaks from measurements were analyzed and fit using the Avantage program.

The stopping and range of ions in matter (SRIM) simulation: The range of the ion (atoms) penetration into silver substrate and the recoil energy were simulated using the SRIM software. For comparison, the ions were given the energy of either 100 eV or 10 keV. All data and figures were generated automatically by the software.

Figures 8A, 8B, 8C, 8D:
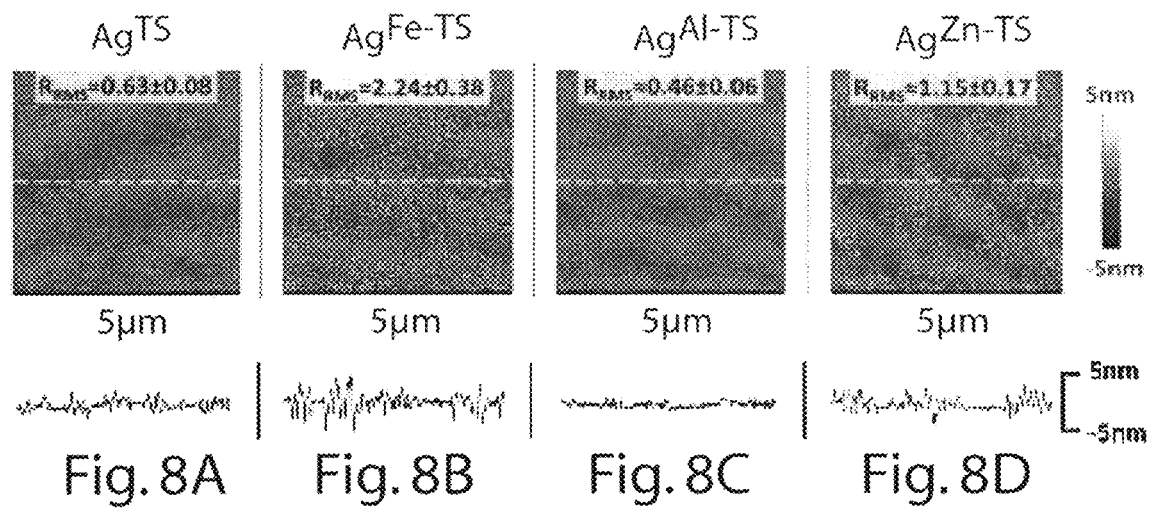
Figure 8E:
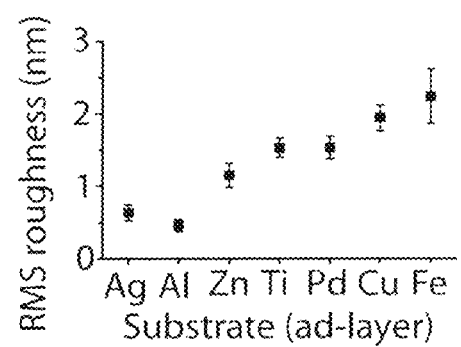

All Ag films were deposited on an atomically flat Si [100] surface, with its native oxide layer, using e-beam evaporation. All ad-layers were slow deposited by sputtering. Template stripped surfaces were prepared as previously reported, (references 16, 17, 23, 30) to give $Ag^{TS}$ or $Ag^{M-TS}$. Atomic force microscopy (AFM) was used to image the topography of all template-stripped Ag surfaces. To investigate the effect of lattice mismatch on Ag, two metals (Zn, Fe) with large lattice mismatch and one lattice matched metal (Al) were deposited on 200 nm Ag film. FIGS. 8A-8D show the AFM images of template stripped surface, indicating that the topography of the $Ag^{M-TS}$ surfaces differ from that of original film upon deposition of the ad-layers. The template stripped silver surface, $Ag^{TS}$, (without an ad-layer, FIG. 8A) has $R_{RMS}$=0.63±0.08 nm, as previously reported. Template striping the Ag with Fe ad-layer film ($Ag^{Fe-TS}$), however, reveals a significantly rougher surface, $R_{RMS}$=2.240.38 nm, (FIG. 8B). The $Ag^{Fe-TS}$ surface has larger and deeper grain boundaries as revealed by the cross-section line scan extracted from the AFM and confirmed by 3D view of the surface. Unlike Fe, deposition of aluminum (Al) onto Ag, $Ag^{Al-TS}$, led to significantly lower $R_{RMS}$ (0.46±0.06 nm), FIG. 8C. The cross-section line scan indicates the existence of step edges on the surface, which is not observed on $Ag^{Fe-TS}$. Similarly, the $Ag^{Zn-TS}$ surface has $R_{RMS}$=1.15±0.17 nm and has a few large grains surrounded by many small grains (FIG. 8D). The observation that the roughness RMS, $Ag^{Al-TS}<Ag^{TS}<Ag^{Zn-TS}<Ag^{FoTe}$, with copper and titanium (Cu, Ti, large lattice mismatch), and palladium (Pd, median lattice mismatch). FIG. 8E summarizes all the roughness RMS data, indicating that the response of the Ag film to the ad-layer depends on the identity of deposited metal and that the surface roughness is tunable with a well-distributed gradient.

Figure 8F:
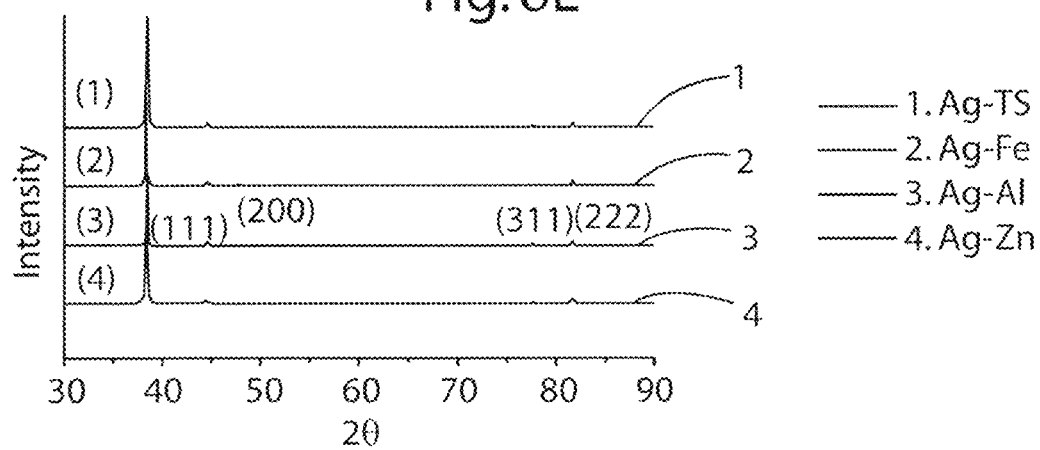

The wide angle X-ray diffraction patterns (FIG. 8F) suggests that the crystal orientation of the Ag metal on the surface is dominated by [111] direction with small amount of [200] and [311] orientation. According to the X-ray results, the reconstruction of Ag/substrate interface, by remote mechanical annealing process, does not change the crystal structure of the interfaces, and therefore, the template stripped Ag surfaces.

Figure 9A:
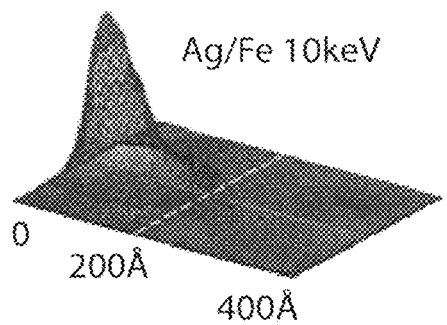
FIG. 9A-9F show simulation of ion (atom) penetration and recoil energy during sputtering and the comparison of lattice mismatch (silver and ad-layer metal) and RMS roughness of template-stripped surface.
Figure 9B:
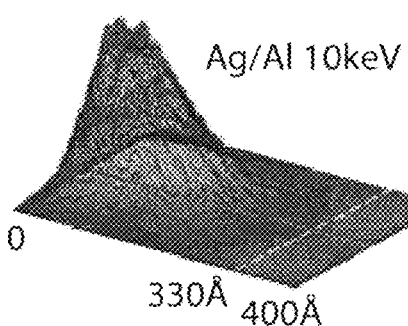
Figure 9C:
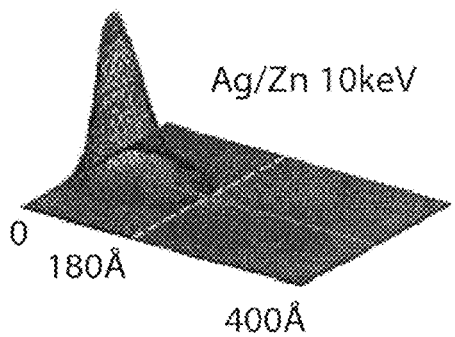
Figure 9D:
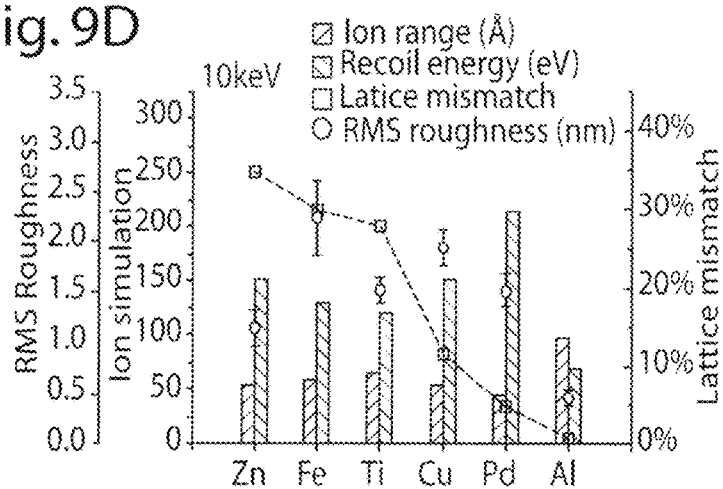
Figure 9E:
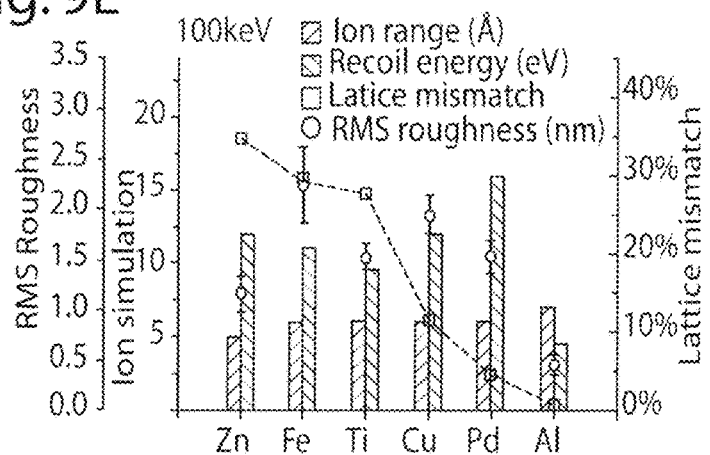
Figure 9F:
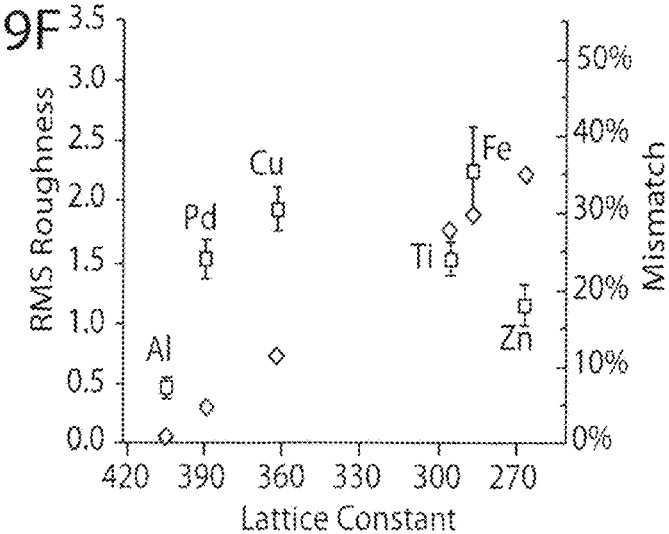

To investigate the interface and atom-atom interactions at the Ag/ad-layer interface, the Stopping and Range of Ions in Matter (SRIM) platform (references 31-36) was used to simulate the ion penetration on the Ag substrates and energy dissipation (Kinchin-Peace damage). The atoms were first given an energy of 10 keV, which was close to the energy used for ion implantation, and the penetration of the atoms were investigated (FIGS. 9A-9C). Al has the largest diffusion depth (~330 Å, along the surface normal, <20% of the film thickness) and largest transverse diffusion distance, radius ~220 Å. Zn has the smallest diffusion depth (~180 Å) and the smallest transverse diffusion distance (radius ~110 Å). Since Al has the smallest atomic radius, it is anticipated that it would have the largest penetration depth and lowest stress on the Ag film. FIG. 9D summarizes the simulated average values of ion penetration (Al, Fe, Zn, Pd, Cu, Ti). All samples have the penetration range smaller than 10 nm (at 10 keV). The recoil energies of atoms are within the range of 250 eV, which is insignificant compared to the given initial energy 10 keV (2.5%). Most of the energy is absorbed by the substrate hence less energy for the recoil cascades. For most sputtering systems, the impinging atoms have a lower energy. Simulation of the ad-layer atoms at 100 eV is more realistic for sputtering systems. FIG. 9E shows that the penetration of metal atoms, at 100 eV, into the Ag substrate, resides within the range of 1 nm (10 Å). These penetrations are negligible compare to the thickness of the Ag film (200 nm). It appears that the region between Ag and metal ad-layers as an interface rather than a diffusion zone. The energy to recoil is also insignificant compared to the given energy of 100 eV, which indicates that most of the energy is absorbed by the Ag substrate. Neither the energy to recoil nor the penetration depth of ions is correlated with surface roughness of the $Ag^{M-TS}$ (FIGS. 9D-9E). Since considering ad-layer atoms and the physical nature of the heteroepitaxy deposition of the film does not allow an explanation of the reconstruction, we compare $R_{RMS}$ to the materials' lattice constant mismatch, a source of misfit stress (FIG. 9F). No clear correlation between $R_{RMS}$ and lattice mismatch was observed, indicating that either, i) the simulated data is not accurate, hence an empirical characterization is needed, or, ii) there are other forms of interactions at the interface besides lattice mismatch (other source of strain besides misfit stress).

From the SRIM simulation, most of the energy is absorbed by the substrate with small amount translated to recoil energy loss. According to Kinchin-Pease model, the energy loss excites the valence electrons in metals (reference 42) and can lead to secondary source of strain due to generation of Frenkel pairs.

Although the inventors do not wish or intend to be bound by any theory or explanation, there appears to be an electronic interaction between the Ag substrate and the ad-layer atoms that can be taken into consideration. Consideration of the atomic binding energy (as defined by Lackmann) of two transitional metal atoms is reviewed. Lackmann and coworkers (reference 43) developed a theoretical method to calculate the atomic binding energy (ABE) of transition-metal atoms adsorbed on a second transition metal due to electronic valence shell interaction, based on tight-binding approximations. In order to simplify the original Lackmann model, the inventors captured potential for electronic interaction through the standard (reference) reduction potential (redox potential), E°, of different metals. From Table 1, FIG. 10, Au has the highest reduction potential, hence it is less reactive and as such would have the least possibility of valence shell interaction with the ad-layer atoms. Unlike Au, Ag exhibits higher reactivity (E°=0.8 V vs 1.7 V for Au) and, as such, Ag is predicted to have stronger electronic valence shell interaction with impinging metal atoms which would lead to higher strain and reconstruction. There is also higher possibility of ionization, due to the kinetic energy of ad-layer atoms, hence a higher possibility of Kinchin-Pease damage which is proportional to the charge, $Z_m$, of the metal.

The oxidation states of ad-layer metals were confirmed with XPS, while Pd was assumed to be oxidized to Pd(II) since XPS cannot identify the existence of Pd(II). Cu and Fe had multiple oxidation state, while the other metals had the oxidation state listed in Table 1, FIG. 10. The reference redox potential of Cu and Fe are, thus, estimated as the mean value of the two oxidation states.

From Example 2, it is apparent that embodiments of the present invention provide a fabrication method, designated remote interfacial stress-induced mechanical annealing, that can be used to tune the roughness of corresponding template stripped surface of reactive metal through felicitous choice of an ad-layer, which largely depends on the lattice constant mismatch, designated $f_m$, and atomic binding energy due to valence shell electronic interaction (represented by reference redox potential mismatch, designated E°).

Example 2 demonstrates the effect of ductility and reactivity (redox potential) of metal, i.e. silver, Ag, on tuning the surface morphology through a surface/interface reconstruction method, the so-called "remote mechanical annealing" (ReMA). Interfacial stress in Ag thin films by coating ad-layers induces fracture and thus enlarges the grain boundaries on the Ag/substrate (Si [100]) interface, leading to modification of Ag surfaces roughness and morphology. The effect of interfacial stress annealing depends on the metal "ad-layer", where the roughness of template stripped surface varies with the identity of the adsorbed metal. The roughness is tunable and has a wide range from 0.45 nm to 3.5 nm (RMS roughness). By sputter coating different metal onto Ag thin film, the Ag/substrate interface is reconstructed, leading to a tunable topography and surface roughness.

Both simulation and experiments were used to analyze ad-layer atom penetration. Both the electronic interaction between Ag and ad-layer metals and lattice mismatch were explored to explain the multi-component annealing coefficient of this method embodiment of the invention. The lattice mismatch component fits data from gold surface while both lattice mismatch and electronic component can be considered in analyzing the surface roughness of silver surface.

A Roughness-Redox-Mismatch diagram may map out the relation between ad-layer metal properties and the roughness of resultant Ag surfaces wherein a calibration curve based on the relation of $R_{RMS}$ and metal's properties (lattice and chemistry) is developed. Surfaces with certain topography and roughness can, therefore, be designed and fabricated by introducing an appropriate ad-layer. The coupling of the Lackmann atomic binding energy and lattice constant mismatch may be used to engineer a surface with desired roughness and morphology.

While the invention has been described in terms of specific embodiments thereof, those skilled in the art will appreciate that modifications and changes can be made thereto within the scope of the appended claims.

References, which are incorporated herein by reference:
1. S.-J. Cho, C. Wang, N.-Y. Kim, Nano-scale surface morphology optimization of the ohmic contacts and electrical properties of AlGaN/GaN high electron mobility transistors using a rapid thermal annealing dielectric protection layer. *Thin Solid Films* 557, 262-267 (2014)
2. A. Fontsere, A. Perez-Tomas, M. Placidi, J. Llobet, N. Baron, S. Chenot, Y. Cordier, J. C. Moreno, V. Iglesias, M. Porti, A. Bayerl, M. Lanza, M. Nafria, Gate current analysis of AlGaN/GaN on silicon heterojunction transistors at the nanoscale. *Appl. Phys. Lett.* 101, 093505/093501-093505/093504 (2012)
3. S. Pelloquin, G. Saint-Girons, N. Baboux, D. Albertini, W. Hourani, J. Penuelas, G. Grenet, C. Plossu, G. Hollinger, LaAlO3/Si capacitors. Comparison of different molecular beam deposition conditions and their impact on electrical properties. *J. Appl. Phys.* (Melville, N.Y., U. S.) 113, 034106/034101-034106/034107 (2013)
4. H. Saghrouni, S. Jomni, W. Belgacem, N. Hamdaoui, L. Beji, Physical and electrical characteristics of metal/Dy2O3/p-GaAs structure. *Phys. B* (Amsterdam, Neth.) 444, 58-64 (2014)
5. S. Conoci, S. Petralia, P. Samori, F. M. Raymo, S. Di Bella, S. Sortino, Optically transparent, ultrathin Pt films as versatile metal substrates for molecular optoelectronics. *Adv. Funct. Mater.* 16, 1425-1432 (2006)
6. S. Nakamura, The roles of structural imperfections in InGaN-based blue light-emitting diodes and laser diodes. *Science* (Washington, D.C.) 281, 956-961 (1998)
7. P. Nagpal, N. C. Lindquist, S.-H. Oh, D. J. Norris, Ultra smooth Patterned Metals for Plasmonics and Metamaterials. *Science* (Washington, D.C., U.S.) 325, 594-597 (2009)
8. M. Bosman, L. Zhang, H. Duan, S. F. Tan, C. A. Nijhuis, C.-W. Qiu, J. K. W. Yang, Encapsulated Annealing: Enhancing the Plasmon Quality Factor in Lithographically-Defined Nanostructures. *Sci. Rep.* 4, 5537 (2014)
9. S. F. Tan, L. Wu, J. K. W. Yang, P. Bai, M. Bosman, C. A. Nijhuis, Quantum Plasmon Resonances Controlled by Molecular Tunnel Junctions. *Science* (Washington, D.C., U.S.) 343, 1496-1499 (2014)
10. J. Narayan, B. C. Larson, Domain epitaxy: a unified paradigm for thin film growth. *J. Appl. Phys.* 93, 278-285 (2003)
11. B. Wu, A. Kumar, Extreme ultraviolet lithography: A review. *J. Vac. Sci. Technol., B: Microelectron. Nanometer Struct.—Process., Meas., Phenom.* 25, 1743-1761 (2007)
12. L. Yuan, L. Jiang, D. Thompson, C. A. Nijhuis, On the Remarkable Role of Surface Topography of the Bottom Electrodes in Blocking Leakage Currents in Molecular Diodes. *J. Am. Chem. Soc.* 136, 6554-6557 (2014)
13. L. Yuan, L. Jiang, B. Zhang, C. A. Nijhuis, Dependency of the tunneling decay coefficient in molecular tunneling junctions on the topography of the bottom electrodes. *Angew. Chem., Int. Ed.* 53, 3377-3381 (2014)
14. E. A. Weiss, R. C. Chiechi, G. K. Kaufman, J. K. Kriebel, Z. Li, M. Duati, M. A. Rampi, G. M. Whitesides, Influence of defects on the electrical characteristics of mercury-drop junctions. Self-assembled monolayers of n-alkanethiolates on rough and smooth silver. *J. Am. Chem. Soc.* 129, 4336-4349 (2007)
15. H. Sirringhaus, Reliability of organic field-effect transistors. *Adv. Mater.* (Weinheim, Ger) 21, 3859-3873 (2009)
16. J. Chen, Z. Wang, S. Oyola-Reynoso, S. M. Gathiaka, M. Thuo, Limits to the Effect of Substrate Roughness or Smoothness on the Odd-Even Effect in Wetting Properties of n-Alkanethiolate Monolayers. *Langmuir* 31, 7047-7054 (2015)
17. L. B. Newcomb, I. D. Tevis, M. B. J. Atkinson, S. M. Gathiaka, R. E. Luna, M. Thuo, Odd-Even Effect in the Hydrophobicity of n-Alkanethiolate Self-Assembled Monolayers Depends upon the Roughness of the Substrate and the Orientation of the Terminal Moiety. *Langmuir* 30, 11985-11992 (2014)
18. M. S. Miller, M.-A. Ferrato, A. Niec, M. C. Biesinger, T. B. Carmichael, Ultrasmooth Gold Surfaces Prepared by Chemical Mechanical Polishing for Applications in Nanoscience. *Langmuir* 30, 14171-14178 (2014)
19. M. Saif Islam, G. Y. Jung, T. Ha, D. R. Stewart, Y. Chen, S. Y. Wang, R. S. Williams, Ultra-smooth platinum surfaces for nanoscale devices fabricated using chemical mechanical polishing. *Appl. Phys. A: Mater. Sci. Process.* 80, 1385-1389 (2005)
20. V. J. Logeeswaran, M. L. Chan, Y. Bayam, M. Saif Islam, D. A. Horsley, X. Li, W. Wu, S. Y. Wang, R. S. Williams, Ultra-smooth metal surfaces generated by pressure-induced surface deformation of thin metal films. *Appl. Phys. A* 87, 187-192 (2007)
21. N. Vogel, J. Zieleniecki, I. Koeper, As flat as it gets: ultrasmooth surfaces from template-stripping procedures. *Nanoscale* 4, 3820-3832 (2012)
22. E. A. Weiss, G. K. Kaufman, J. K. Kriebel, Z. Li, R. Schalek, G. M. Whitesides, Si/SiO2-Templated Formation of Ultraflat Metal Surfaces on Glass, Polymer, and Solder Supports: Their Use as Substrates for Self-Assembled Monolayers. *Langmuir* 23, 9686-9694 (2007)
23. M. M. Thuo, W. F. Reus, C. A. Nijhuis, J. R. Barber, C. Kim, M. D. Schulz, G. M. Whitesides, Odd-Even Effects In Charge Transport across Self-Assembled Monolayers. *J Am. Chem. Soc.* 133, 2962-2975 (2011)
24. L. T. Banner, A. Richter, E. Pinkhassik, Pinhole-free large-grained atomically smooth Au(111) substrates prepared by flame-annealed template stripping. *Surf Interface Anal.* 41, 49-55 (2009)
25. M. Hegner, P. Wagner, G. Semenza, Ultralarge atomically flat template-stripped gold surfaces for scanning probe microscopy. *Surf. Sci.* 291, 39-46 (1993)
26. E. Chason, J. Yin, K. Tetz, R. Beresford, L. B. Freund, M. Ujue Gonzalez, J. A. Floro, In situ measurements of stress relaxation during strained layer heteroepitaxy. *Mater. Res. Soc. Symp. Proc.* 583, 167-175 (2000)
27. A. G. Cullis, The morphology and misfit dislocation formation characteristics of strained heteroepitaxial layers: ex situ and in situ growth studies. *Scanning Microsc.* 8, 957-967 (1994)
28. B. K. Ghosh, T. Tanikawa, A. Hashimoto, A. Yamamoto, Y. Ito, Reduced-stress GaN epitaxial layers grown on Si(111) by using a porous GaN interlayer converted from GaAs. *J. Cryst. Growth* 249, 422-428 (2003)
29. M. Kamiko, R. Suenaga, J.-W. Koo, K. Nose, K. Kyuno, J.-G. Ha, Epitaxial growth of fcc-Ag(001) nanodots on MgO(001) substrates via Ti seed layer-assisted agglomeration. *J. Phys. D Appl. Phys.* 46, 505304/505301-505304/505309, 505309 pp (2013)
30. M. Baghbanzadeh, F. C. Simeone, C. M. Bowers, K.-C. Liao, M. Thuo, M. Baghbanzadeh, M. S. Miller, T. B. Carmichael, G. M. Whitesides, Odd-Even Effects in Charge Transport across n-Alkanethiolate-Based SAMs. *J. Am. Chem. Soc.* 136, 16919-16925 (2014)

31. J. F. Ziegler, Stopping of energetic light ions in elemental matter. *J. Appl. Phys.* 85, 1249-1272 (1999)
32. J. F. Ziegler, The stopping of energetic ions in solids. *Nucl. Instrum. Methods* 168, 17-24 (1980)
33. J. F. Ziegler, *The Stopping and Ranges of Ions in Matter, Vol. 4: Helium: Stopping Powers and Ranges in All Elemental Matter.* (1978), pp. 374 pp.
34. J. F. Ziegler, J. P. Biersack, U. Littmark, *The Stopping and Ranges of Ions in Matter, Vol. 1: The Stopping and Range of Ions in Solids.* (1985), pp. 321 pp.
35. J. F. Ziegler, Editor, *The Stopping and Ranges of Ions in Matter, Vol. 5: Handbook of Stopping Cross Sections for Energetic Ions in all Elements.* (1980), pp. 424 pp.
36. J. F. Ziegler, M. D. Ziegler, J. P. Biersack, SRIM—The stopping and range of ions in matter (2010). *Nucl. Instrum. Methods Phys. Res., Sect. B* 268, 1818-1823 (2010)
37. S. K. D. S. D. Ekpe, in *Reactive Sputter Deposition*, S. M. Diederik Depla, Ed. (Springer Berlin Heidelberg, 2008), pp. 229-254.
38. A. Rahmati, Reactive magnetron sputter deposition of (Ti,Cu)N nano-crystalline thin films: modeling of particle and energy flux toward the substrate. *Phys. Scr.* 86, 025301/025301-025301/025310 (2012)
39. S. Seeger, K. Harbauer, K. Ellmer, Ion-energy distributions at a substrate in reactive magnetron sputtering discharges in Ar/H2S from copper, indium, and tungsten targets. *J. Appl. Phys.* 105, 053305/053301-053305/053308 (2009)
40. S. Huefner, *Photoelectron Spectroscopy: Principles and Applications, Second Edition.* (Springer, 1996), pp. 516 pp.
41. S. Tanuma, C. J. Powell, D. R. Penn, Calculations of electron inelastic mean free paths. IX: Data for 41 elemental solids over the 50 eV to 30 keV range. *Surf Interface Anal.* 43, 689-713 (2011)
42. E. S. Mashkova, V. A. Molchanov, *Modern Problems in Condensed Matter Sciences, Vol. 11: Medium-Energy Ion Reflection from Solids.* (Elsevier, 1985), pp. 434 pp.
43. F. Cyrot-Lackmann, F. Ducastelle, Binding energies of transition-metal atoms adsorbed on a transition metal. *Phys. Rev. B* [3]4, 2406-2412 (1971)

We claim:

1. A method of preparing a metal surface, comprising:
    impinging a layer of a metallic material layer on an ultra-flat substrate surface with incoming metal or metalloid atoms comprising at least one of Fe, V, Cr, Mn, Ta, Sc, Zr, Nb, Ru, Pd, Cu, Ti, Zn, Re, W, Al, Ga, In, Sn, Bi, Li, Ca, and Mg, wherein the substrate is relatively harder than the metallic material layer, the impinging comprising depositing the incoming atoms onto the metallic material layer with sputtering from a target source as an additive layer comprising at least a reference or measured lattice constant sufficiently different from a reference or measured lattice constant of the metallic material layer to provide reduced surface roughness of the surface of the metallic material layer adjacent to the substrate surface, wherein the surface of the metallic material layer adjacent to the substrate surface has an average RMS surface roughness of less than 0.45 nm; and
    separating the metallic material layer from the substrate surface.
2. The method of claim 1 wherein the lattice constant mismatch % between the metallic atoms of the additive layer and the metallic atoms of the metallic material layer is greater than about 0.1% to achieve the average RMS surface roughness of less than 0.45 nm.
3. The method of claim 2 wherein the metallic material is sufficiently ductile to be strained against the substrate surface in the presence of the mismatch of lattice constants by impingement and solidification of the incoming atoms.
4. The method of claim 1 wherein said average RMS surface roughness is the range of about 0.18 nm to about 0.3 nm.
5. The method of claim 1 wherein the deposited additive layer has a reference or measured lattice constant and atomic binding energy represented by its reference redox potential sufficiently different from a reference or measured lattice constant or atomic binding energy represented by reference redox potential of the metallic material layer to provide reduced surface roughness of the surface of the metallic material layer adjacent to the substrate surface.
6. The method of claim 1 wherein the substrate material comprises a Si wafer, mica, gypsum, or a single crystal.
7. The method of claim 1 wherein the metallic material comprises a noble metal comprising at least one of Au, Ag, Pt, and Pd.
8. The method of claim 1 wherein the metallic material comprises a metal comprising at least one of Cu, Re, Ru, Ti, and V.
9. The method of claim 1 wherein the metallic material layer is provided by physical vapor deposition of the metallic material on the substrate surface.
10. The method of claim 1 wherein
    the incoming metal or metalloid atoms comprise a transition metal comprising at least one of Fe, V, Cr, Mn, Ta, Sc, Zr, Nb, Ru, Pd, Cu, Ti, Zn, Re, and W, or
    wherein the incoming metal or metalloid atoms further comprise Ni, or
    a combination thereof.
11. The method of claim 1 wherein the incoming metal or metalloid atoms comprise at least one of Al, Ga, In, Sn, and Bi.
12. The method of claim 1 wherein the metallic material layer has a thickness from 100 nm to 600 nm.
13. The method of claim 1, wherein the impinged layer of metallic material comprises:
    a surface with a surface roughness between about 0.18 to about 0.45 nm average RMS roughness; and
    an opposite surface comprising the additive layer deposited thereon.
14. A method of preparing a metal surface with controlled surface roughness, comprising:
    impinging a metallic material layer on a substrate surface with incoming metallic atoms comprising at least one of Fe, V, Cr, Mn, Ta, Sc, Zr, Nb, Ru, Pd, Cu, Ti, Zn, Re, W, Al, Ga, In, Sn, Bi, Li, Ca, and Mg, wherein the substrate is relatively harder than the metallic material layer, the impinging comprising depositing the incoming metallic atoms onto the metallic material layer with sputtering from a target source as an additive layer comprising at least a reference or measured lattice constant sufficiently different from a reference or measured lattice constant of the metallic material of the metallic material layer to provide a controlled change in surface roughness of the surface of the metallic material layer adjacent to the substrate surface to an average RMS surface roughness of less than 5 nm; and
    separating the metallic material layer from the substrate surface.
15. The method of claim 14 wherein the deposited additive layer has a reference or measured lattice constant and atomic binding energy represented by its reference redox potential sufficiently different from a reference or measured lattice constant and atomic binding energy represented by a reference redox potential of the metallic material layer to provide the controlled change in surface roughness of the surface of the metallic material layer adjacent to the substrate surface.

16. The method of claim 14 wherein the substrate material comprises a Si wafer, mica, gypsum, or a single crystal.

17. The method of claim 14 wherein the metallic material comprises a noble metal comprising at least one of Au, Ag, Pt, and Pd.

18. The method of claim 14 wherein the metallic material layer is provided by physical vapor deposition of the metallic material on the substrate surface.

19. The method of claim 14 wherein
the incoming metallic atoms comprise a transition metal comprising at least one of Fe, V, Cr, Mn, Ta, Sc, Zr, Nb, Ru, Pd, Cu, Ti, Zn, Re, and W, or
the incoming metallic atoms comprise Ni, or
a combination thereof.

20. The method of claim 14 wherein the incoming metallic atoms comprise at least one of Al, Ga, In, Sn, Pb, and Bi.

21. The method of claim 14 wherein the incoming atoms comprise an alkali or alkali-earth metal or an alloy that comprises at least one of Li, Ca, and Mg.

22. The method of claim 14 wherein the metallic material layer has a thickness from 100 nm to 600 nm.

23. The method of claim 14 wherein surface roughness is controlled in the range between about 0.18 to about 3.5 nm average RMS roughness.

24. The method of claim 14, wherein the impinged layer of metallic material comprises:
a surface with a surface roughness between about 0.18 to about 3.5 nm average RMS roughness; and
an opposite surface comprising the additive layer deposited thereon.

* * * * *